(12) United States Patent
Lee et al.

(10) Patent No.: US 12,212,325 B2
(45) Date of Patent: Jan. 28, 2025

(54) LOW POWER QUADRATURE PHASE DETECTOR

(71) Applicant: MEDIATEK INC., Hsin-Chu (TW)

(72) Inventors: Fong-Wen Lee, Hsinchu (TW); Wen-Chieh Wang, Hsinchu (TW); Yu-Hsin Lin, Hsinchu (TW)

(73) Assignee: MEDIATEK INC., Hsinchu (TW)

( * ) Notice: Subject to any disclaimer, the term of this patent is extended or adjusted under 35 U.S.C. 154(b) by 191 days.

(21) Appl. No.: 17/857,161

(22) Filed: Jul. 4, 2022

(65) Prior Publication Data

US 2023/0113143 A1    Apr. 13, 2023

Related U.S. Application Data

(60) Provisional application No. 63/255,030, filed on Oct. 13, 2021.

(51) Int. Cl.
| | | |
|---|---|---|
| *H03L 7/087* | (2006.01) | |
| *H03K 17/687* | (2006.01) | |
| *H03L 7/07* | (2006.01) | |
| *H03L 7/107* | (2006.01) | |

(52) U.S. Cl.
CPC .......... *H03L 7/087* (2013.01); *H03K 17/687* (2013.01); *H03L 7/07* (2013.01); *H03L 7/107* (2013.01)

(58) Field of Classification Search
CPC ..... H03L 7/00; H03L 7/06; H03L 7/08; H03L 7/085; H03L 7/087; H03L 7/089; H03L 7/091; H03L 7/093; H03L 7/095; H03L 7/097
See application file for complete search history.

(56) References Cited

U.S. PATENT DOCUMENTS

| | | | | |
|---|---|---|---|---|
| 4,682,047 | A * | 7/1987 | von Sichart | H03K 5/1534 |
| | | | | 326/87 |
| 6,605,963 | B2 * | 8/2003 | Kitamoto | H03K 17/102 |
| | | | | 326/62 |
| 11,632,098 | B2 * | 4/2023 | Gathman | H03H 11/0427 |
| | | | | 327/554 |
| 2017/0222796 | A1 | 8/2017 | Chen | |
| 2019/0131962 | A1 | 5/2019 | Jeong | |
| 2020/0186323 | A1 | 6/2020 | Huang | |

FOREIGN PATENT DOCUMENTS

TW    201230691 A1    7/2012

OTHER PUBLICATIONS

Anonymous, Pass transistor logic, Mar. 29, 2021, pp. 1-3, Wikipedia, XP093009148.

Shaik Fairooz et al., Revisiting the Utility of Transmission Gate and Passtransistor Logic Styles in CMOS VLSI Design, 2021 3rd International Conference on Signal Processing and Communication (ICPSC), May 13-14, 2021, Coimbatore, pp. 276-280,2021 IEEE, XP033924761.

* cited by examiner

*Primary Examiner* — Diana J. Cheng
(74) *Attorney, Agent, or Firm* — Winston Hsu

(57) ABSTRACT

The present invention provides a quadrature phase detector including a detection circuit. The detection circuit includes a first switch, a second switch and a first filter, wherein the first switch is controlled by a second clock signal to selectively couple a first clock signal to a first node, the second switch is controlled by the second clock signal to selectively coupled the first node to a reference voltage, and the first filter is configured to filter voltages at the first node to generate a first detection result.

20 Claims, 9 Drawing Sheets

LOW POWER QUADRATURE PHASE DETECTOR

CROSS REFERENCE TO RELATED APPLICATIONS

This application claims the benefit of U.S. Provisional Application No. 63/255,030, filed on Oct. 13, 2021. The content of the application is incorporated herein by reference.

BACKGROUND

A quadrature phase detector is usually provided to detect a phase difference between an in-phase clock signal and a quadrature clock signal, and a detection result of the quadrature phase detector may be used by a clock signal generator or a delay element to adjust the phase of the in-phase clock signal or the quadrature clock signal. The conventional quadrature phase detector is usually implemented by using active devices such as XOR gates, however, using XOR gates may increase the power consumption. In addition, if the quadrature phase detector is designed to detect four clock signals whose phases are 0 degree, 90 degrees, 180 degrees and 270 degrees, four sets of circuits are designed to detect the phase difference between clock signals with 0 degree and 90 degrees, the phase difference between clock signals with 90 degrees and 180 degrees, the phase difference between clock signals with 180 degrees and 270 degrees, and the phase difference between clock signals with 270 degrees and 0 degree. However, there may be mismatches between the four sets of circuits due to the semiconductor process, causing phase detection mismatches or phase detection errors.

SUMMARY

It is therefore an objective of the present invention to provide a quadrature phase detector in which most of the components are implemented by using passive components, to lower power consumption and improve the phase detection mismatches.

According to one embodiment of the present invention, a quadrature phase detector comprising a detection circuit is disclosed. The detection circuit comprises a first switch, a second switch and a first filter, wherein the first switch is controlled by a second clock signal to selectively couple a first clock signal to a first node, the second switch is controlled by the second clock signal to selectively coupled the first node to a reference voltage, and the first filter is configured to filter voltages at the first node to generate a first detection result.

According to one embodiment of the present invention, a circuitry comprising a clock signal generator, a detection circuit and a control circuit is disclosed. The clock signal generator is configured to generate a first clock signal and a second clock signal. The detection circuit comprises a first switch, a second switch and a first filter, wherein the first switch is controlled by a second clock signal to selectively couple a first clock signal to a first node, the second switch is controlled by the second clock signal to selectively coupled the first node to a reference voltage, and the first filter is configured to filter voltages at the first node to generate a first detection result. The control circuit is configured to generate a control signal to adjust a phase of the first clock signal or the second clock signal according to the first detection result.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ". The terms "couple" and "couples" are intended to mean either an indirect or a direct electrical connection. Thus, if a first device couples to a second device, that connection may be through a direct electrical connection, or through an indirect electrical connection via other devices and connections.

Figure 1:
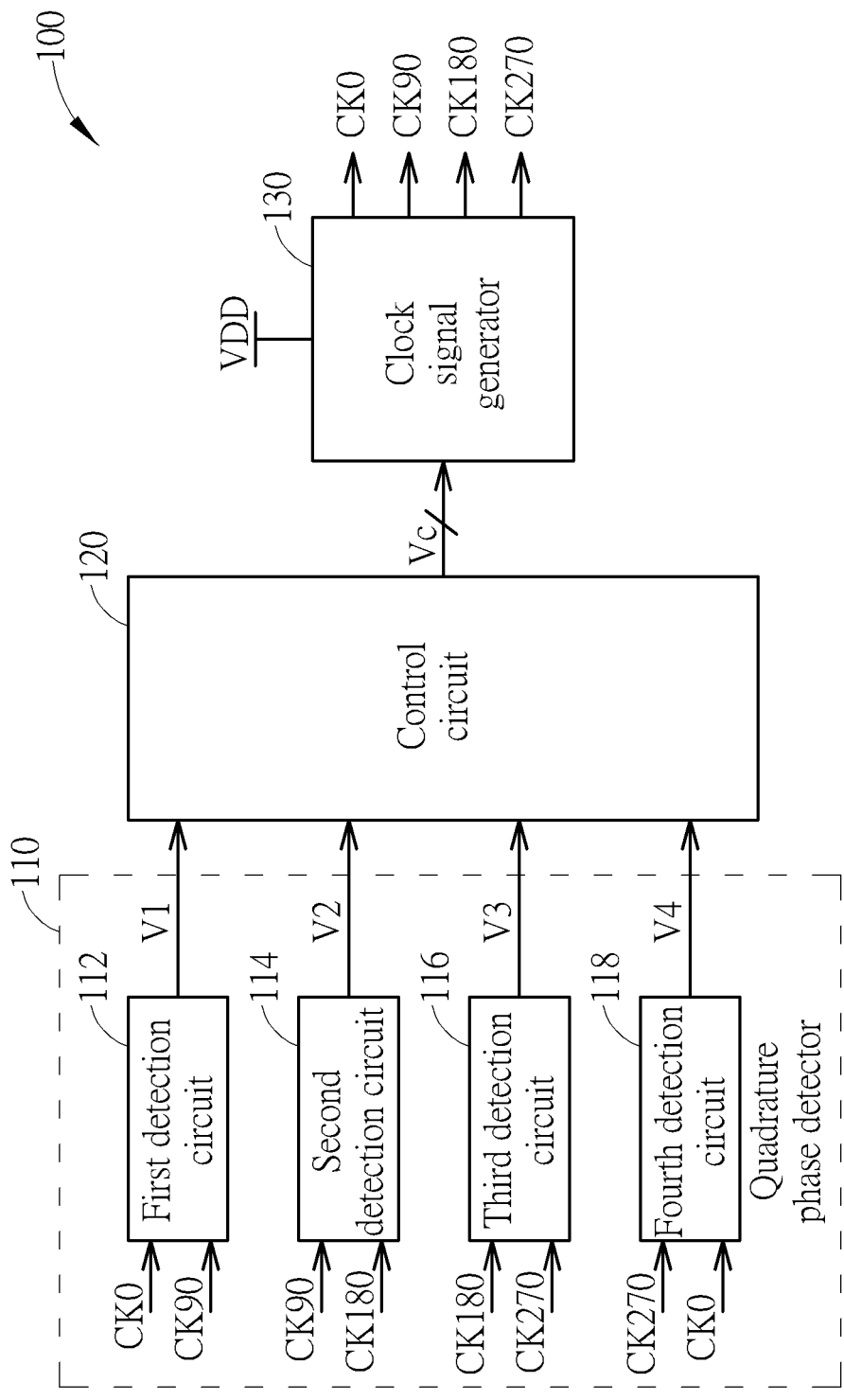
FIG. 1 is a diagram illustrating a circuitry according to one embodiment of the present invention.

FIG. 1 is a diagram illustrating a circuitry 100 according to one embodiment of the present invention. As shown in FIG. 1, the circuitry 100 comprises a quadrature phase detector 110, a control circuit 120 and a clock signal generator 130, wherein the quadrature phase detector 110 comprises a first detection circuit 112, a second detection circuit 114, a third detection circuit 116 and a fourth detection circuit 118. In this embodiment, the circuitry 100 is configured to generate four clock signals CK0, CK90, CK180 and CK270 with ideal phases of 0 degree, 90 degrees, 180 degrees and 270 degrees, respectively.

In the operation of the circuitry 100, the quadrature phase detector 110 is configured to detect phase differences between any two adjacent clock signals to generate detection results.

Specifically, the first detection circuit 112 is configured to detect a phase difference between the clock signals CK0 and CK90 to generate a first detection result V1, the second detection circuit 114 is configured to detect a phase difference between the clock signals CK90 and CK180 to generate a second detection result V2, the third detection circuit 116 is configured to detect a phase difference between the clock signals CK180 and CK270 to generate a third detection result V3, and the fourth detection circuit 118 is configured to detect a phase difference between the clock signals CK270 and CK0 to generate a fourth detection result V4. Then, the control circuit 120 refers to the first detection result V1, the second detection result V2, the third detection result V3 and the fourth detection result V4 to determine if any one of the clock signals CK0 CK90, CK180 and CK270 needs to adjust the phase, and at least one control signal Vc is generated accordingly. Specifically, the control circuit 120 can refer to the first detection result V1 to determine if the phase difference between the clock signals CK0 and CK90 is not equal to 90 degrees, and to generate the control signal Vc to the clock signal generator 130 to adjust the phase of the clock signal CK90. The control circuit 120 can refer to the second detection result V2 to determine if the phase difference between the clock signals CK90 and CK180 is not equal to 90 degrees, and to generate the control signal Vc to the clock signal generator 130 to adjust the phase of the clock signal CK180. The control circuit 120 can refer to the third detection result V3 to determine if the phase difference between the clock signals CK180 and CK270 is not equal to 90 degrees, and to generate the control signal Vc to the clock signal generator 130 to adjust the phase of the clock signal CK270. The control circuit 120 can refer to the fourth detection result V4 to determine if the phase difference between the clock signals CK270 and CK0 is not equal to 90 degrees, and to generate the control signal Vc to the clock signal generator 130 to adjust the phase of the clock signal CK0.

In this embodiment, at least a portion of the first detection circuit 112, the second detection circuit 114 and the third detection circuit 116 and the fourth detection circuit 118 are designed so that most of the components are implemented by using passive components, to lower power consumption and improve the phase detection mismatches.

Figure 2:
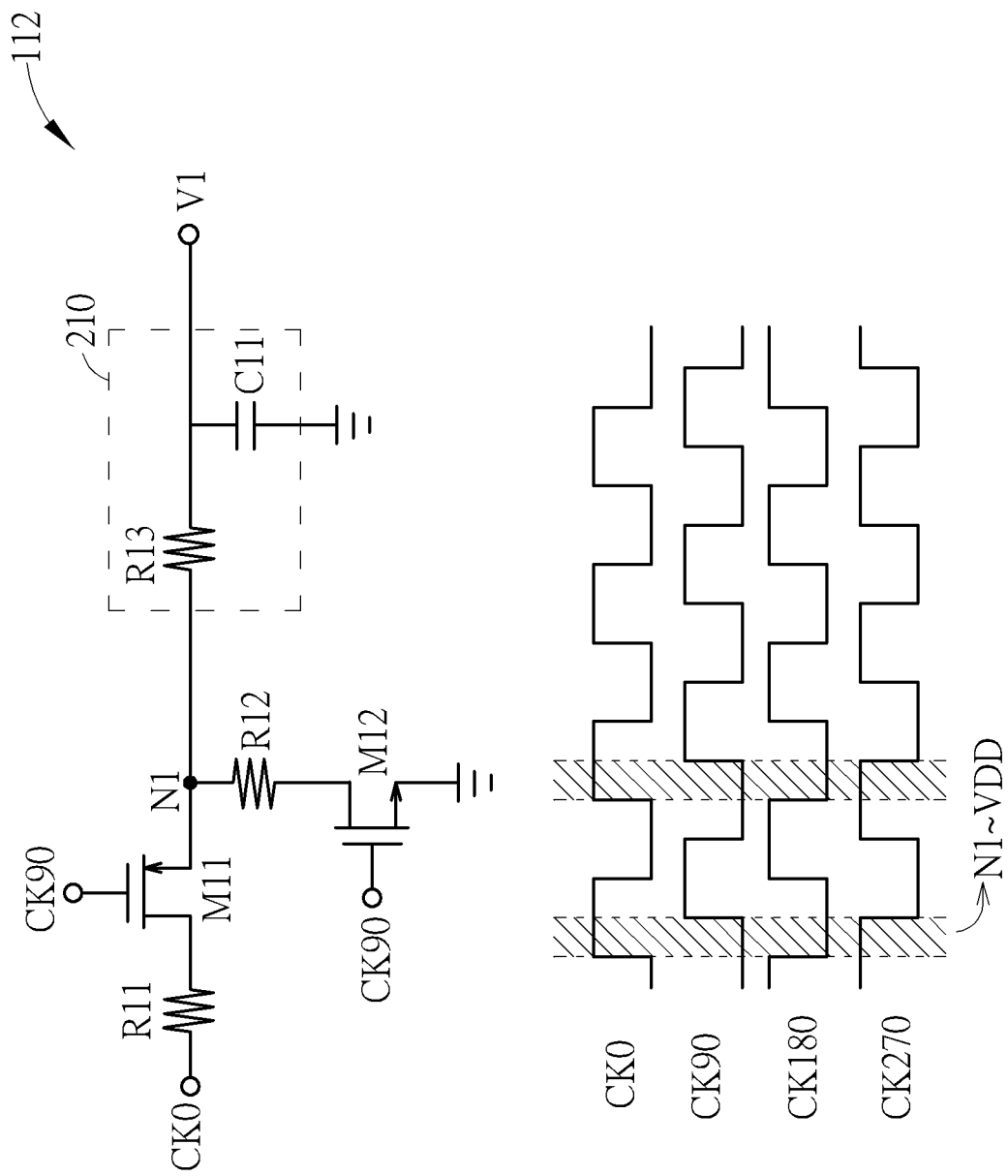
FIG. 2 is a diagram illustrating the first detection circuit according to one embodiment of the present invention.

FIG. 2 is a diagram illustrating the first detection circuit 112 according to one embodiment of the present invention. As shown in FIG. 2, the first detection circuit 112 comprises transistors M11, M12, resistors R11, R12 and a low-pass filter 210, wherein the low-pass filter 210 comprises a resistor R13 and a capacitor C11. In this embodiment, the transistor M11 is a P-type transistor while the transistor M12 is an N-type transistor, a gate electrode of the transistor M11 is coupled to the clock signal CK90, a first electrode of the M11 is coupled to a first electrode of the transistor M12 via the node N1 and the resistor R12, a second electrode of the transistor M11 is coupled to the clock signal CK0 via the resistor R11, and a second electrode of the transistor M12 is coupled to a ground voltage.

In another embodiment, the transistor M11 can be replaced by a switch with any different type, and this switch is controlled by the clock signal CK90 to selectively connect the clock signal CK0 to the node N1. In addition, the transistor M12 can be replaced by a switch with any different type, and this switch is controlled by the clock signal CK90 to selectively connect the node N1 to the ground voltage.

In the operation of the first detection circuit 112, when the clock signal CK90 has a low voltage (e.g. ground voltage or 0V) and the clock signal CK0 has a high voltage such as a supply voltage VDD of the clock signal generator 130, the node N1 will have the high voltage (e.g. VDD); when both the clock signals CK90 and CK0 have the low voltage, the node N1 will have the low voltage; and when the clock signal CK90 has the high voltage, the node N1 will always have the low voltage because the transistor M12 with larger driving ability discharges the node N1. Therefore, because the node N1 has the high voltage only during quarter-cycle of the clock signal CK0/CK90, the first detection result V1 generated by filtering the voltage of the node N1 should be equal to (¼)*VDD if the phase difference between the clock signals CK0 and CK90 is exactly equal to 90 degrees.

In one embodiment, if the first detection result V1 is lower than (¼)*VDD, it means that the phase difference between the clock signals CK0 and CK90 is less than 90 degrees, and the control circuit 120 may generate the control signal Vc to control the clock signal generator 130 to delay the phase of the clock signal CK90. Similarly, if the first detection result V1 is greater than (¼)*VDD, it means that the phase difference between the clock signals CK0 and CK90 is greater than 90 degrees, and the control circuit 120 may generate the control signal Vc to control the clock signal generator 130 to advance the phase of the clock signal CK90.

In the embodiment shown in FIG. 2, the first detection circuit 112 is configured to detect the phase difference based on rising edges of the clock signals CK0 and CK90. In another embodiment, the transistor M11 may be implemented by an N-type transistor while the transistor M12 is implemented by the P-type transistor, for detecting the phase difference based on falling edges of the clock signals CK0 and CK90.

Figure 3:
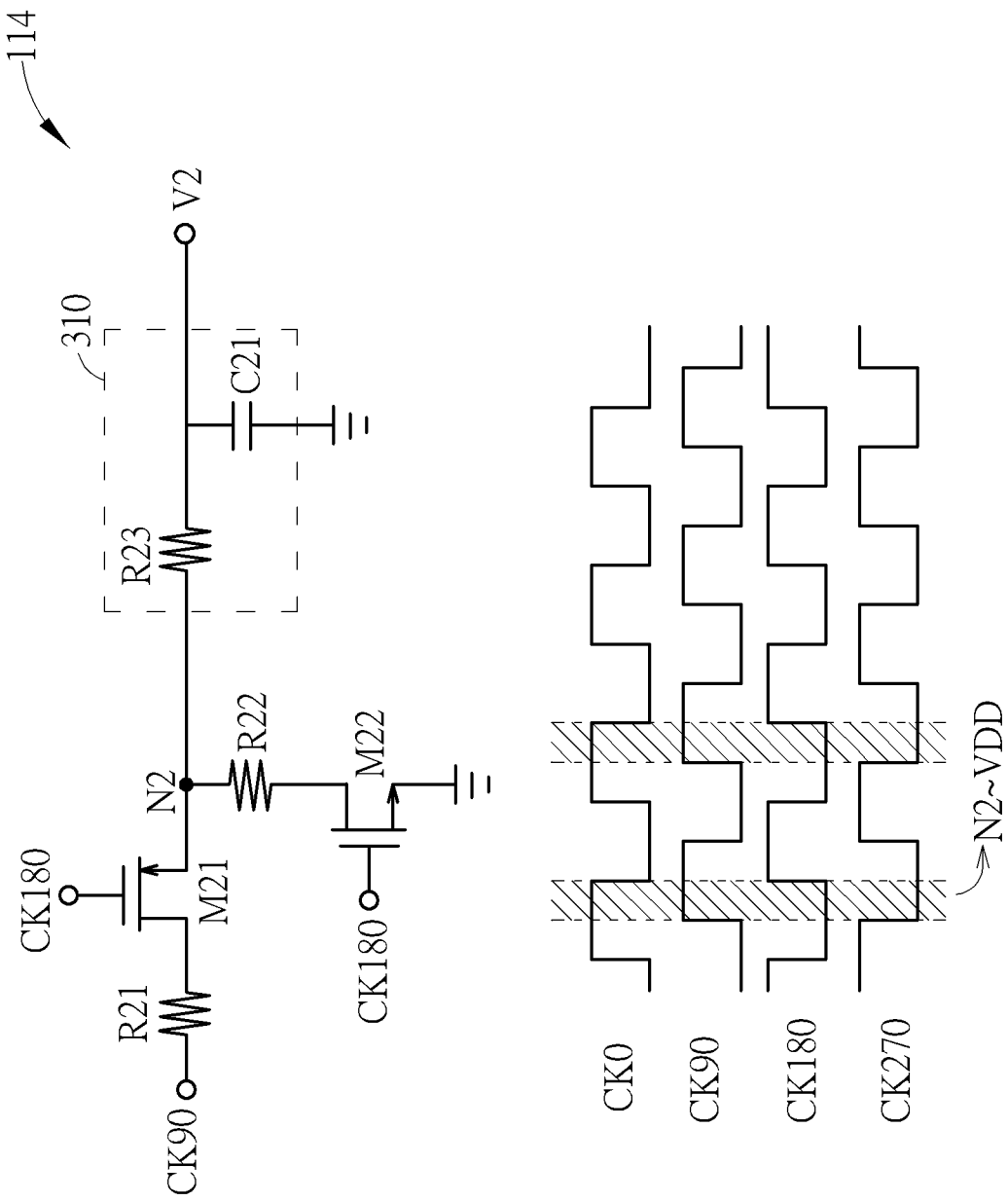
FIG. 3 is a diagram illustrating the second detection circuit according to one embodiment of the present invention.

FIG. 3 is a diagram illustrating the second detection circuit 114 according to one embodiment of the present invention. As shown in FIG. 3, the second detection circuit 114 comprises transistors M21, M22, resistors R21, R22 and a low-pass filter 310, wherein the low-pass filter 310 comprises a resistor R23 and a capacitor C21. In this embodiment, the transistor M21 is a P-type transistor while the transistor M22 is an N-type transistor, a gate electrode of the transistor M21 is coupled to the clock signal CK180, a first electrode of the M21 is coupled to a first electrode of the transistor M22 via the node N2 and the resistor R22, a second electrode of the transistor M21 is coupled to the clock signal CK90 via the resistor R21, and a second electrode of the transistor M22 is coupled to the ground voltage.

In another embodiment, the transistor M21 can be replaced by a switch with any different type, and this switch is controlled by the clock signal CK180 to selectively connect the clock signal CK90 to the node N2. In addition, the transistor M22 can be replaced by a switch with any different type, and this switch is controlled by the clock signal CK180 to selectively connect the node N2 to the ground voltage.

In the operation of the second detection circuit 114, when the clock signal CK180 has a low voltage (e.g. ground voltage or 0V) and the clock signal CK90 has a high voltage such as a supply voltage VDD of the clock signal generator 130, the node N2 will have the high voltage (e.g. VDD); when both the clock signals CK180 and CK90 have the low voltage, the node N2 will have the low voltage; and when the clock signal CK180 has the high voltage, the node N2 will always have the low voltage because the transistor M22 with larger driving ability discharges the node N2. Therefore, because the node N2 has the high voltage only during quarter-cycle of the clock signal CK90/CK180, the second detection result V2 generated by filtering the voltage of the node N2 should be equal to (¼)*VDD if the phase difference between the clock signals CK90 and CK180 is exactly equal to 90 degrees.

In one embodiment, if the second detection result V2 is lower than (¼)*VDD, it means that the phase difference between the clock signals CK90 and CK180 is less than 90 degrees, and the control circuit 120 may generate the control signal Vc to control the clock signal generator 130 to delay the phase of the clock signal CK180.

Similarly, if the second detection result V2 is greater than ($\frac{1}{4}$)*VDD, it means that the phase difference between the clock signals CK90 and CK180 is greater than 90 degrees, and the control circuit 120 may generate the control signal Vc to control the clock signal generator 130 to advance the phase of the clock signal CK180.

In the embodiment shown in FIG. 3, the second detection circuit 114 is configured to detect the phase difference based on rising edges of the clock signals CK90 and CK180. In another embodiment, the transistor M21 may be implemented by the N-type transistor while the transistor M22 is implemented by the P-type transistor, for detecting the phase difference based on falling edges of the clock signals CK90 and CK180.

Figure 4:
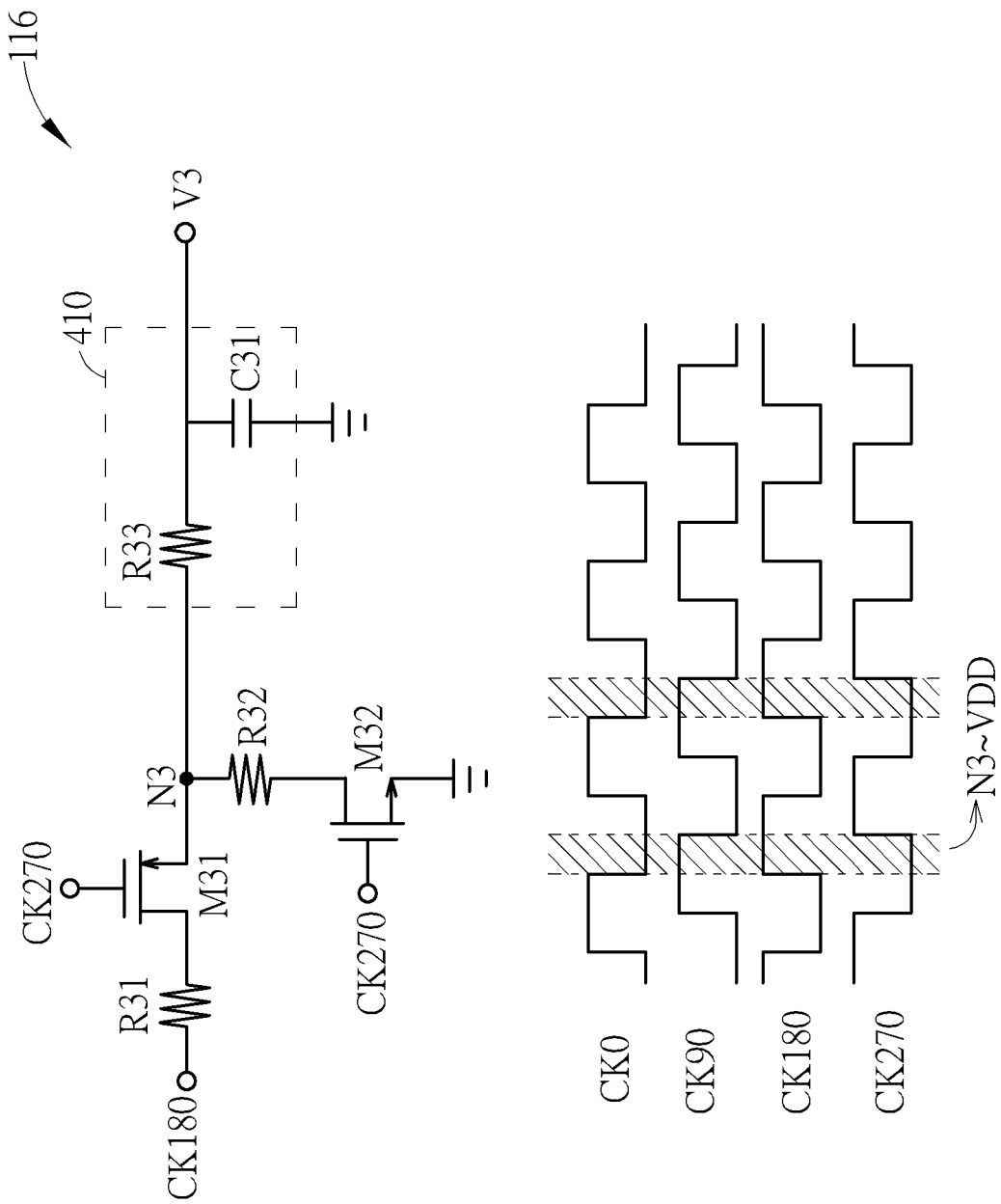
FIG. 4 is a diagram illustrating the third detection circuit according to one embodiment of the present invention.

FIG. 4 is a diagram illustrating the third detection circuit 116 according to one embodiment of the present invention. As shown in FIG. 4, the third detection circuit 116 comprises transistors M31, M32, resistors R31, R32 and a low-pass filter 410, wherein the low-pass filter 410 comprises a resistor R33 and a capacitor C31. In this embodiment, the transistor M31 is the P-type transistor while the transistor M32 is the N-type transistor, a gate electrode of the transistor M31 is coupled to the clock signal CK270, a first electrode of the M31 is coupled to a first electrode of the transistor M32 via the node N3 and the resistor R32, a second electrode of the transistor M31 is coupled to the clock signal CK180 via the resistor R31, and a second electrode of the transistor M32 is coupled to the ground voltage.

In another embodiment, the transistor M31 can be replaced by a switch with any different type, and this switch is controlled by the clock signal CK270 to selectively connect the clock signal CK180 to the node N3. In addition, the transistor M32 can be replaced by a switch with any different type, and this switch is controlled by the clock signal CK270 to selectively connect the node N3 to the ground voltage.

In the operation of the third detection circuit 116, when the clock signal CK270 has a low voltage (e.g. ground voltage or 0V) and the clock signal CK180 has a high voltage such as a supply voltage VDD of the clock signal generator 130, the node N3 will have the high voltage (e.g. VDD); when both the clock signals CK270 and CK180 have the low voltage, the node N3 will have the low voltage; and when the clock signal CK270 has the high voltage, the node N3 will always have the low voltage because the transistor M32 with larger driving ability discharges the node N3. Therefore, because the node N3 has the high voltage only during quarter-cycle of the clock signal CK180/CK270, the third detection result V3 generated by filtering the voltage of the node N3 should be equal to ($\frac{1}{4}$)*VDD if the phase difference between the clock signals CK180 and CK270 is exactly equal to 90 degrees.

In one embodiment, if the third detection result V3 is lower than ($\frac{1}{4}$)*VDD, it means that the phase difference between the clock signals CK180 and CK270 is less than 90 degrees, and the control circuit 120 may generate the control signal Vc to control the clock signal generator 130 to delay the phase of the clock signal CK270. Similarly, if the third detection result V3 is greater than ($\frac{1}{4}$)*VDD, it means that the phase difference between the clock signals CK180 and CK270 is greater than 90 degrees, and the control circuit 120 may generate the control signal Vc to control the clock signal generator 130 to advance the phase of the clock signal CK270.

In the embodiment shown in FIG. 4, the third detection circuit 116 is configured to detect the phase difference based on rising edges of the clock signals CK180 and CK270. In another embodiment, the transistor M31 may be implemented by the N-type transistor while the transistor M32 is implemented by the P-type transistor, for detecting the phase difference based on falling edges of the clock signals CK180 and CK270.

Figure 5:
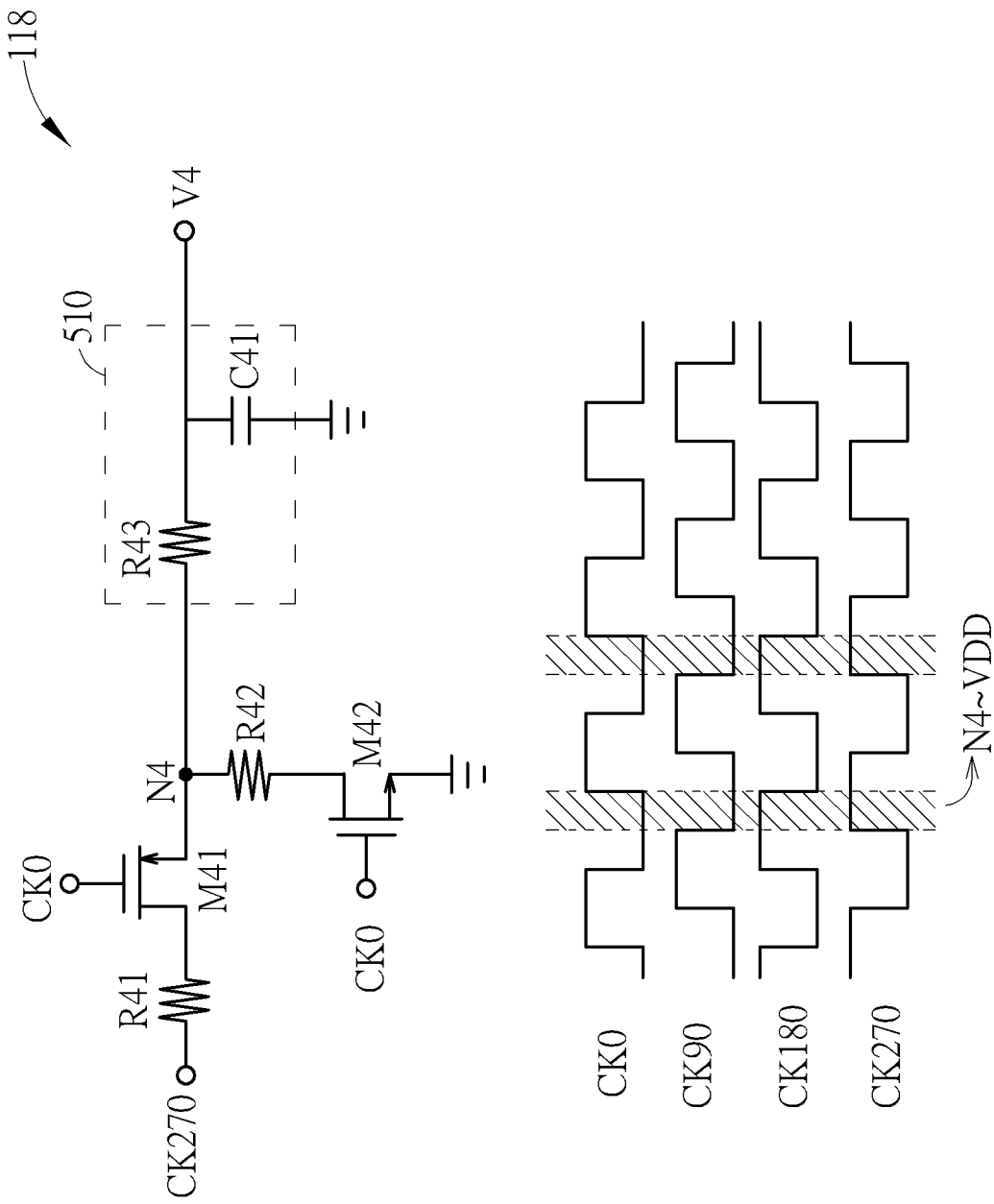
FIG. 5 is a diagram illustrating the fourth detection circuit according to one embodiment of the present invention.

FIG. 5 is a diagram illustrating the fourth detection circuit 118 according to one embodiment of the present invention. As shown in FIG. 5, the fourth detection circuit 118 comprises transistors M41, M42, resistors R41, R42 and a low-pass filter 510, wherein the low-pass filter 510 comprises a resistor R43 and a capacitor C41. In this embodiment, the transistor M41 is the P-type transistor while the transistor M42 is the N-type transistor, a gate electrode of the transistor M41 is coupled to the clock signal CK0, a first electrode of the M41 is coupled to a first electrode of the transistor M42 via the node N4 and the resistor R42, a second electrode of the transistor M41 is coupled to the clock signal CK270 via the resistor R41, and a second electrode of the transistor M42 is coupled to the ground voltage.

In another embodiment, the transistor M41 can be replaced by a switch with any different type, and this switch is controlled by the clock signal CK0 to selectively connect the clock signal CK270 to the node N4. In addition, the transistor M42 can be replaced by a switch with any different type, and this switch is controlled by the clock signal CK0 to selectively connect the node N4 to the ground voltage.

In the operation of the fourth detection circuit 118, when the clock signal CK0 has a low voltage (e.g. ground voltage or 0V) and the clock signal CK270 has a high voltage such as a supply voltage VDD of the clock signal generator 130, the node N4 will have the high voltage (e.g. VDD); when both the clock signals CK0 and CK270 have the low voltage, the node N4 will have the low voltage; and when the clock signal CK0 has the high voltage, the node N4 will always have the low voltage because the transistor M42 with larger driving ability discharges the node N4. Therefore, because the node N4 has the high voltage only during quarter-cycle of the clock signal CK270/CK0, the fourth detection result V4 generated by filtering the voltage of the node N4 should be equal to ($\frac{1}{4}$)*VDD if the phase difference between the clock signals CK270 and CK0 is exactly equal to 90 degrees.

In one embodiment, if the fourth detection result V4 is lower than ($\frac{1}{4}$)*VDD, it means that the phase difference between the clock signals CK270 and CK0 is less than 90 degrees, and the control circuit 120 may generate the control signal Vc to control the clock signal generator 130 to delay the phase of the clock signal CK0. Similarly, if the fourth detection result V4 is greater than ($\frac{1}{4}$)*VDD, it means that the phase difference between the clock signals CK270 and CK0 is greater than 90 degrees, and the control circuit 120 may generate the control signal Vc to control the clock signal generator 130 to advance the phase of the clock signal CK0.

In the embodiment shown in FIG. 5, the fourth detection circuit 118 is configured to detect the phase difference based on rising edges of the clock signals CK270 and CK0. In another embodiment, the transistor M41 may be implemented by the N-type transistor while the transistor M42 is implemented by the P-type transistor, for detecting the phase difference based on falling edges of the clock signals CK270 and CK180.

In the embodiment shown in FIGS. 2-5, because the components within the first detection circuit 112, the second detection circuit 114, the third detection circuit 116 and the fourth detection circuit 118 do not need to be powered by the supply voltage VDD, power consumption of the circuitry 100 can be greatly reduced. In addition, because the passive devices such as resistors R11, R21, R31 and R41 have small errors in process, phase detection mismatches of the first detection circuit 112, the second detection circuit 114, the third detection circuit 116 and the fourth detection circuit 118 can be improved.

Figure 6:
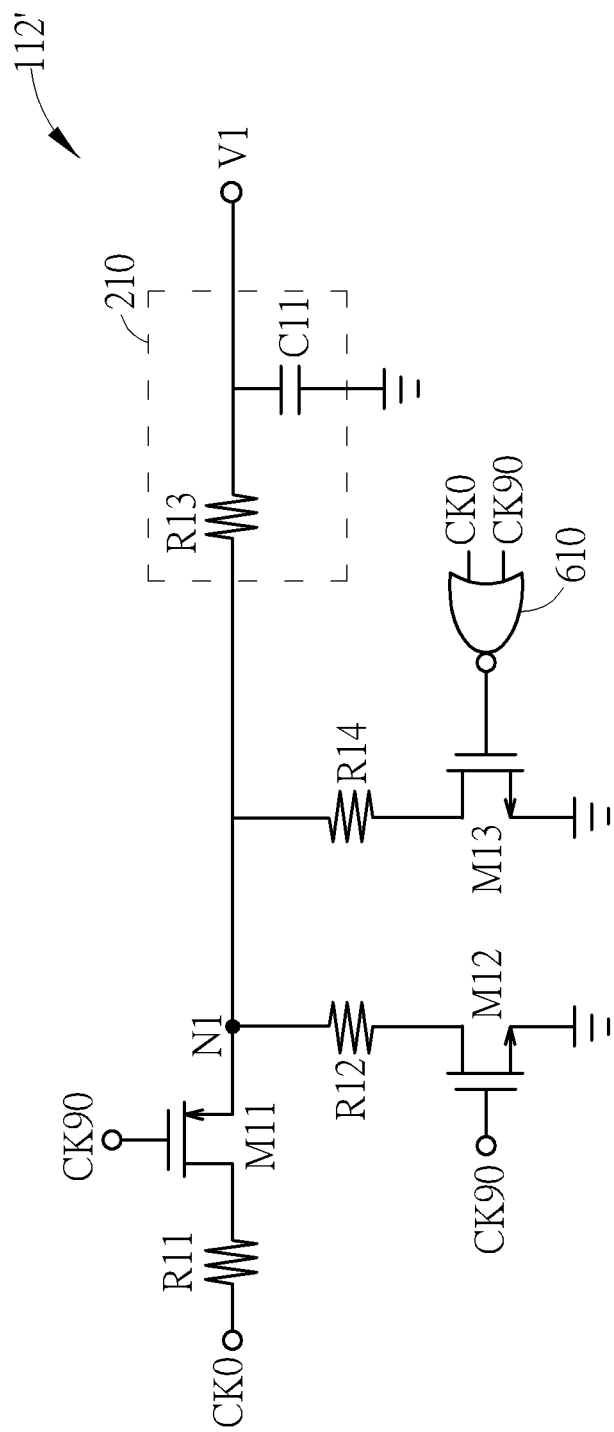
FIG. 6 is a diagram illustrating the first detection circuit according to one embodiment of the present invention.

In the first detection circuit 112 shown in FIG. 2, the node N1 may not exactly have the ground voltage or 0V when both the clock signals CK0 and CK90 have the low voltage due to large turn-on resistance of the transistor M11, causing the first detection result V1 has error. To solve this problem, the first detection circuit 112 can be modified to have a compensation circuit to control the node N1 to have the ground voltage or 0V when both the clock signals CK0 and CK90 have the low voltage. Referring to FIG. 6, the first detection circuit 112' further comprises the compensation circuit including a transistor M13, a resistor R14 and a NOR gate 610, wherein the NOR gate 610 receives the clock signals CK0 and CK90. In the operation of the compensation circuit shown in FIG. 6, when both the clock signals CK0 and CK90 have the low voltage, an output signal of the NOR gate 610 will enable the transistor M13 to discharge the node N1, so that the node N1 can have the ground voltage. Therefore, the first detection result V1 can reflect the phase difference of the clock signals CK0 and CK90 more accurately.

It is noted that the compensation circuit shown in FIG. 6 is for illustrative, not a limitation of the present invention. As long as the compensation circuit can discharge the node N1 when the transistor M11 is enabled and the clock signal CK0 has the low voltage (i.e., both the clock signals CK0 and CK90 have the low voltage), the compensation circuit can have any other suitable design. In one embodiment, the compensation circuit discharges the node N1 only when the transistor M11 is enabled and the clock signal CK0 has the low voltage.

In addition, for the case that the transistor M11 is implemented by the N-type transistor, the compensation circuit is designed so that the node N1 is discharged when the clock signal CK0 has the low voltage and the clock signal CK90 have the high voltage.

Figure 7:
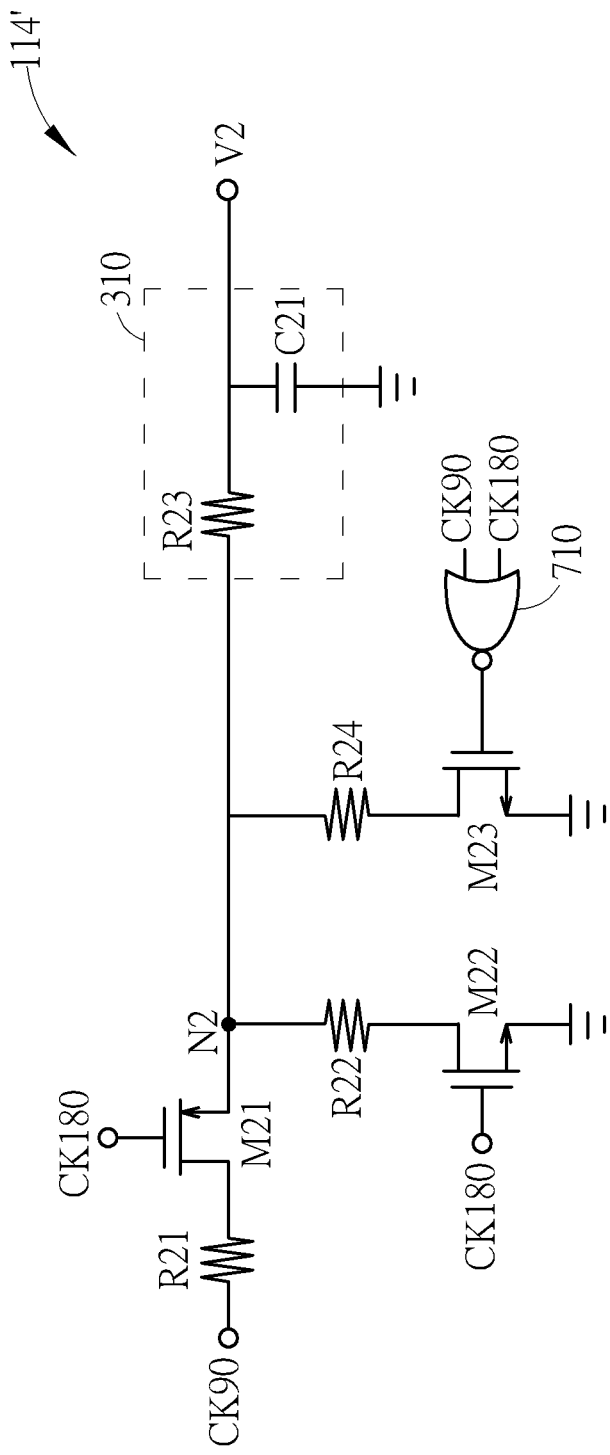
FIG. 7 is a diagram illustrating the second detection circuit according to one embodiment of the present invention.

In the second detection circuit 114 shown in FIG. 3, the node N2 may not exactly have the ground voltage or 0V when both the clock signals CK90 and CK180 have the low voltage due to large turn-on resistance of the transistor M21, causing the second detection result V2 has error. To solve this problem, the second detection circuit 114 can be modified to have a compensation circuit to control the node N2 to have the ground voltage or 0V when both the clock signals CK90 and CK180 have the low voltage. Referring to FIG. 7, the second detection circuit 114' further comprises the compensation circuit including a transistor M23, a resistor R24 and a NOR gate 710, wherein the NOR gate 710 receives the clock signals CK90 and CK180. In the operation of the compensation circuit shown in FIG. 7, when both the clock signals CK90 and CK180 have the low voltage, an output signal of the NOR gate 710 will enable the transistor M23 to discharge the node N2, so that the node N2 can have the ground voltage. Therefore, the second detection result V2 can reflect the phase difference of the clock signals CK90 and CK180 more accurately.

Figure 8:
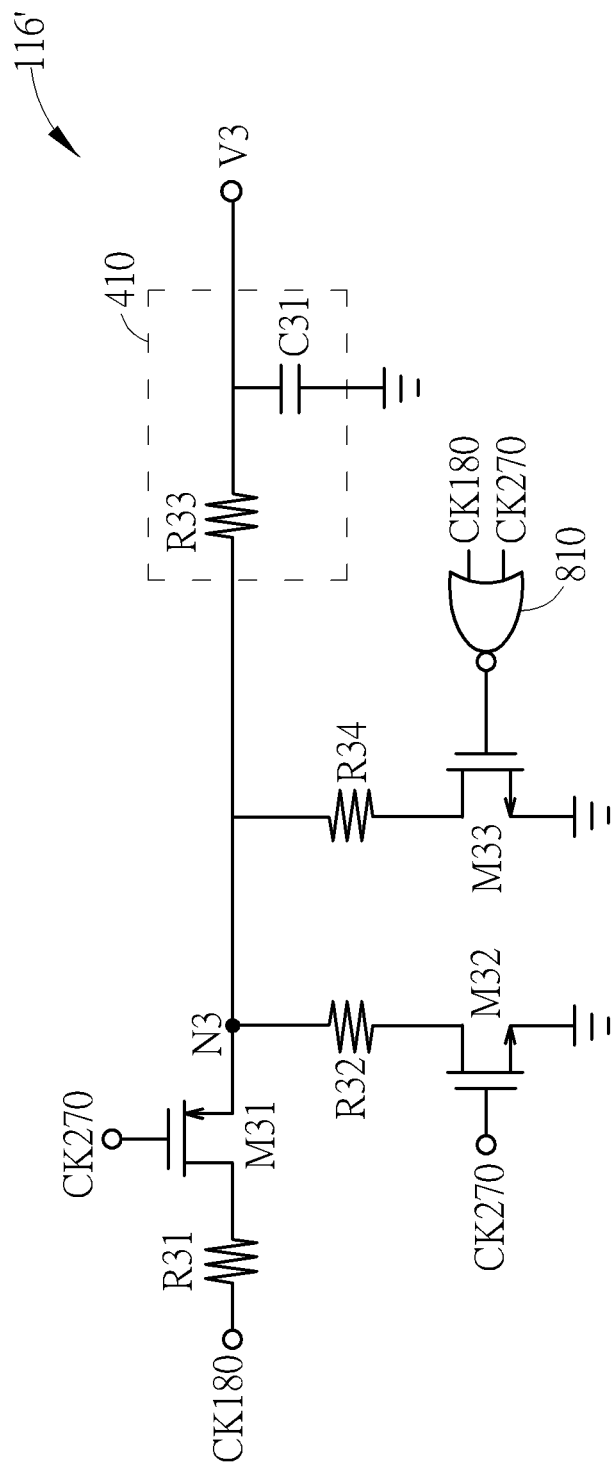
FIG. 8 is a diagram illustrating the third detection circuit according to one embodiment of the present invention.

In the third detection circuit 116 shown in FIG. 4, the node N3 may not exactly have the ground voltage or 0V when both the clock signals CK180 and CK270 have the low voltage due to large turn-on resistance of the transistor M31, causing the second detection result V3 has error. To solve this problem, the third detection circuit 116 can be modified to have a compensation circuit to control the node N3 to have the ground voltage or 0V when both the clock signals CK180 and CK270 have the low voltage. Referring to FIG. 8, the third detection circuit 116' further comprises the compensation circuit including a transistor M33, a resistor R34 and a NOR gate 810, wherein the NOR gate 810 receives the clock signals CK180 and CK270. In the operation of the compensation circuit shown in FIG. 8, when both the clock signals CK180 and CK270 have the low voltage, an output signal of the NOR gate 810 will enable the transistor M33 to discharge the node N3, so that the node N3 can have the ground voltage. Therefore, the second detection result V3 can reflect the phase difference of the clock signals CK180 and CK270 more accurately.

Figure 9:
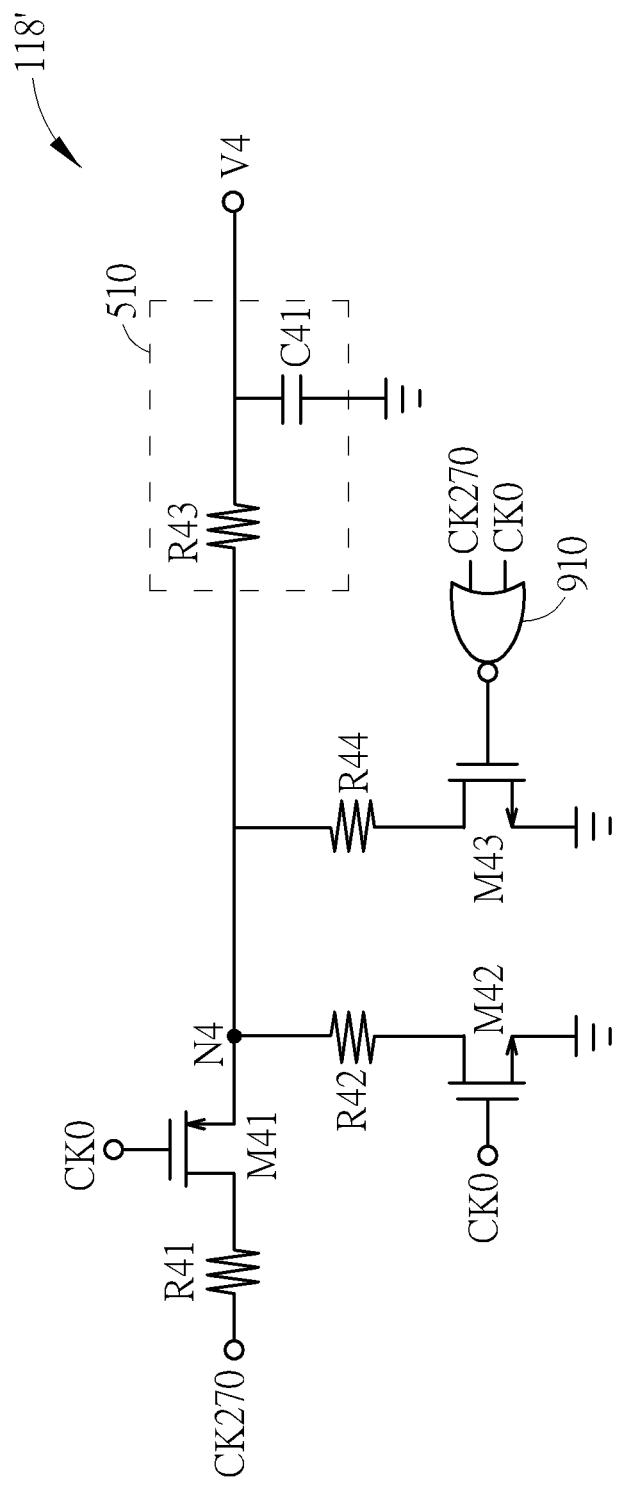
FIG. 9 is a diagram illustrating the fourth detection circuit according to one embodiment of the present invention.

In the fourth detection circuit 118 shown in FIG. 5, the node N4 may not exactly have the ground voltage or 0V when both the clock signals CK270 and CK0 have the low voltage due to large turn-on resistance of the transistor M41, causing the second detection result V4 has error. To solve this problem, the third detection circuit 118 can be modified to have a compensation circuit to control the node N4 to have the ground voltage or 0V when both the clock signals CK270 and CK0 have the low voltage. Referring to FIG. 9, the fourth detection circuit 118' further comprises the compensation circuit including a transistor M43, a resistor R44 and a NOR gate 910, wherein the NOR gate 910 receives the clock signals CK270 and CK0. In the operation of the compensation circuit shown in FIG. 9, when both the clock signals CK270 and CK0 have the low voltage, an output signal of the NOR gate 910 will enable the transistor M43 to discharge the node N4, so that the node N4 can have the ground voltage. Therefore, the second detection result V4 can reflect the phase difference of the clock signals CK270 and CK0 more accurately.

In the embodiment shown in FIGS. 6-9, because most of the components within the first detection circuit 112', the second detection circuit 114', the third detection circuit 116' and the fourth detection circuit 118' do not need to be powered by the supply voltage VDD, power consumption of the circuitry 100 can be greatly reduced. In addition, because the passive devices such as resistors R11, R21, R31 and R41 have small errors in process, phase detection mismatches of the first detection circuit 112', the second detection circuit 114', the third detection circuit 116' and the fourth detection circuit 118' can be improved.

It is noted that quantity of the detection circuits within the quadrature phase detector 110 is for illustrative, not a limitation of the present invention. In other embodiments, the quadrature phase detector 110 may have the first detection circuit 112 only, or the quadrature phase detector 110 may have the first detection circuit 112 and the second detection circuit 114 only, or the quadrature phase detector 110 may have the first detection circuit 112, the second detection circuit 114 and the third detection circuit 116 only. These alternative designs should fall within the scope of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A quadrature phase detector, comprising:
   a first detection circuit configured to detect a phase difference between a first clock signal and a second clock signal, comprising:
   a first switch, wherein the first switch is controlled by the second clock signal to selectively couple the first clock signal to a first node;
   a second switch, wherein the second switch is controlled by the second clock signal to selectively couple the first node to a ground voltage, wherein the second switch and the first switch are controlled by the second clock signal with a same phase; and
   a first filter, configured to filter voltages at the first node to generate a first detection result, wherein the first detection result indicates the phase difference between the first clock signal and the second clock signal.

2. The quadrature phase detector of claim 1, wherein the first switch is a first transistor comprising a gate electrode, a first electrode and a second electrode, wherein the first transistor receives the first clock signal at the second electrode, and receives the second clock signal at the gate electrode; and the second switch is a second transistor comprising a gate electrode, a first electrode and a second electrode, wherein the first electrode of the second transistor is coupled to the first electrode of the first transistor at the first node, the second transistor receives the second clock signal at the gate electrode, and the second electrode of the second transistor is coupled to the ground voltage.

3. The quadrature phase detector of claim 2, wherein the first transistor is a P-type transistor, and the second transistor is an N-type transistor.

4. The quadrature phase detector of claim 2, wherein the first transistor is an N-type transistor, and the second transistor is a P-type transistor.

5. The quadrature phase detector of claim 1, wherein the first detection circuit further comprises:
   a compensation circuit, configured to selectively provide a discharging path for discharging the first node.

6. The quadrature phase detector of claim 5, wherein the compensation circuit is configured to provide the discharging path to discharge the first node when the first switch is enabled and the first clock signal has a low voltage level.

7. A quadrature phase detector, comprising:
   a first detection circuit configured to detect a phase difference between a first clock signal and a second clock signal, comprising:
   a first switch, wherein the first switch is controlled by the second clock signal to selectively couple the first clock signal to a first node;
   a second switch, wherein the second switch is controlled by the second clock signal to selectively couple the first node to a reference voltage; and
   a first filter, configured to filter voltages at the first node to generate a first detection result;
   wherein ideally a phase difference between the first clock signal and the second clock signal is equal to 90 degrees, and the quadrature phase detector further comprises:
   a second detection circuit, comprising:
   a third switch, wherein the third switch is controlled by a third clock signal to selectively couple the second clock signal to a second node;
   a fourth switch, wherein the fourth switch is controlled by the third clock signal to selectively coupled the second node to the reference voltage; and
   a second filter, configured to filter voltages at the second node to generate a second detection result.

8. The quadrature phase detector of claim 7, wherein the third switch is a third transistor comprising a gate electrode, a first electrode and a second electrode, wherein the third transistor receives the second clock signal at the second electrode, and receives a third clock signal at the gate electrode; and the fourth switch is a fourth transistor comprising a gate electrode, a first electrode and a second electrode, wherein the first electrode of the fourth transistor is coupled to the first electrode of the third transistor at the second node, the fourth transistor receives the third clock signal at the gate electrode, and the second electrode of the fourth transistor is coupled to the reference voltage.

9. The quadrature phase detector of claim 7, wherein ideally a phase difference between the second clock signal and the third clock signal is equal to 90 degrees, and the quadrature phase detector further comprises:
   a third detection circuit, comprising:
   a fifth switch, wherein the fifth switch is controlled by a fourth clock signal to selectively couple the third clock signal to a third node;
   a sixth switch, wherein the sixth switch is controlled by the fourth clock signal to selectively coupled the third node to the reference voltage; and
   a third filter, configured to filter voltages at the third node to generate a third detection result.

10. The quadrature phase detector of claim 9, wherein the fifth switch is a fifth transistor comprising a gate electrode, a first electrode and a second electrode, wherein the fifth transistor receives the third clock signal at the second electrode, and receives the fourth clock signal at the gate electrode; and the sixth switch is a sixth transistor comprising a gate electrode, a first electrode and a second electrode, wherein the first electrode of the sixth transistor is coupled to the first electrode of the fifth transistor at the third node, the sixth transistor receives the fourth clock signal at the gate electrode, and the second electrode of the sixth transistor is coupled to the reference voltage.

11. The quadrature phase detector of claim 9, wherein the first clock signal, the second clock signal, the third clock signal and the fourth clock signal are with phases 0 degree, 90 degrees, 180 degrees and 270 degrees, respectively, and the quadrature phase detector further comprises:
   a fourth detection circuit, comprising:
   a seventh switch, wherein the seventh switch is controlled by the first clock signal to selectively couple the fourth clock signal to a fourth node;
   an eighth switch, wherein the eighth switch is controlled by the first clock signal to selectively coupled the fourth node to the reference voltage; and
   a fourth filter, configured to filter voltages at the fourth node to generate a fourth detection result.

12. A circuitry, comprising:
   a clock signal generator, configured to generate a first clock signal and a second clock signal,
   a first detection circuit configured to detect a phase difference between the first clock signal and the second clock signal, comprising:

a first switch, wherein the first switch is controlled by the second clock signal to selectively couple the first clock signal to a first node;

a second switch, wherein the second switch is controlled by the second clock signal to selectively couple the first node to a ground voltage, wherein the second switch and the first switch are controlled by the second clock signal with a same phase; and a first filter, configured to filter voltages at the first node to generate a first detection result, wherein the first detection result indicates the phase difference between the first clock signal and the second clock signal;

a control circuit, coupled to the first detection circuit, configured to generate a control signal to adjust a phase of the first clock signal or the second clock signal according to the first detection result.

13. The circuitry of claim 12, wherein the first switch is a first transistor comprising a gate electrode, a first electrode and a second electrode, wherein the first transistor receives the first clock signal at the second electrode, and receives the second clock signal at the gate electrode; and the second switch is a second transistor comprising a gate electrode, a first electrode and a second electrode, wherein the first electrode of the second transistor is coupled to the first electrode of the first transistor at the first node, the second transistor receives the second clock signal at the gate electrode, and the second electrode of the second transistor is coupled to the ground voltage.

14. The circuitry of claim 13, wherein the first transistor is a P-type transistor, and the second transistor is an N-type transistor.

15. The circuitry of claim 13, wherein the first transistor is an N-type transistor, and the second transistor is a P-type transistor.

16. The circuitry of claim 12, wherein the first detection circuit further comprises:
a compensation circuit, configured to selectively provide a discharging path for discharging the first node.

17. The circuitry of claim 16, wherein the compensation circuit is configured to provide the discharging path to discharge the first node when the first switch is enabled and the first clock signal has a low voltage level.

18. A circuitry, comprising:
a clock signal generator, configured to generate a first clock signal and a second clock signal,
a first detection circuit configured to detect a phase difference between the first clock signal and the second clock signal, comprising:
a first switch, wherein the first switch is controlled by the second clock signal to selectively couple the first clock signal to a first node;
a second switch, wherein the second switch is controlled by the second clock signal to selectively couple the first node to a reference voltage; and
a first filter, configured to filter voltages at the first node to generate a first detection result;

a control circuit, coupled to the first detection circuit, configured to generate a control signal to adjust a phase of the first clock signal or the second clock signal according to the first detection result;

wherein ideally a phase difference between the first clock signal and the second clock signal is equal to 90 degrees, and the quadrature phase detector further comprises:
a second detection circuit, comprising:
a third switch, wherein the third switch is controlled by a third clock signal to selectively couple the second clock signal to a second node;
a fourth switch, wherein the fourth switch is controlled by the third clock signal to selectively coupled the second node to the reference voltage; and
a second filter, configured to filter voltages at the second node to generate a second detection result.

19. The circuitry of claim 18, wherein ideally a phase difference between the second clock signal and the third clock signal is equal to 90 degrees, and the quadrature phase detector further comprises:
a third detection circuit, comprising:
a fifth switch, wherein the fifth switch is controlled by a fourth clock signal to selectively couple the third clock signal to a third node;
a sixth switch, wherein the sixth switch is controlled by the fourth clock signal to selectively coupled the third node to the reference voltage; and
a third filter, configured to filter voltages at the third node to generate a third detection result.

20. The circuitry of claim 19, wherein the first clock signal, the second clock signal, the third clock signal and the fourth clock signal are with phases 0 degree, 90 degrees, 180 degrees and 270 degrees, respectively, and the quadrature phase detector further comprises:
a fourth detection circuit, comprising:
a seventh switch, wherein the seventh switch is controlled by the first clock signal to selectively couple the fourth clock signal to a fourth node;
an eighth switch, wherein the eighth switch is controlled by the first clock signal to selectively coupled the fourth node to the reference voltage; and
a fourth filter, configured to filter voltages at the fourth node to generate a fourth detection result.

* * * * *